United States Patent [19]

Boecker et al.

[11] Patent Number: 4,981,665

[45] Date of Patent: Jan. 1, 1991

[54] HEXAGONAL SILICON CARBIDE PLATELETS AND PREFORMS AND METHODS FOR MAKING AND USING SAME

[75] Inventors: Wolfgang D. G. Boecker, Lewiston; Stephen Chwastiak, East Amherst; Tadeusz M. Korzekwa, Lewiston; Sai-Kwing Lau, East Amherst, all of N.Y.

[73] Assignee: Stemcor Corporation, Cleveland, Ohio

[21] Appl. No.: 185,183

[22] Filed: Apr. 22, 1988

Related U.S. Application Data

[62] Division of Ser. No. 899,523, Aug. 22, 1986, Pat. No. 4,756,895.

[51] Int. Cl.$^5$ .............................................. C01B 31/36
[52] U.S. Cl. .................................. 423/345; 156/603; 156/DIG. 64; 156/DIG. 68; 156/DIG. 13
[58] Field of Search ....... 156/DIG. 64, 603, DIG. 68, 156/DIG. 73; 423/345

[56] References Cited

U.S. PATENT DOCUMENTS

| | | | |
|---|---|---|---|
| Re. 26,941 | 8/1970 | Lowe | 23/208 |
| 2,729,542 | 1/1956 | VanderPyl | 423/345 |
| 3,025,192 | 3/1962 | Lowe | 148/33 |
| 3,147,159 | 9/1964 | Lowe | 437/87 |
| 3,409,402 | 11/1968 | Addamiano | 23/208 |
| 3,520,740 | 7/1970 | Addamiano | 156/612 |
| 3,615,930 | 10/1971 | Knippenberg et al. | 437/100 |
| 3,661,662 | 5/1972 | Allen | 156/62.2 |
| 3,754,076 | 8/1973 | Cutler | 423/345 |
| 3,933,984 | 1/1976 | Kimura et al. | 423/345 |
| 3,956,032 | 5/1976 | Powell et al. | 423/345 |
| 3,960,619 | 6/1976 | Seiter | 423/345 |
| 3,962,406 | 6/1976 | Knippenberg et al. | 423/345 |
| 4,041,117 | 8/1977 | Prochazka | 264/63 |
| 4,147,572 | 4/1979 | Vodakov et al. | 437/89 |
| 4,162,167 | 7/1979 | Enomoto et al. | 501/90 |
| 4,209,474 | 6/1980 | Prochazka | 264/29.5 |
| 4,230,497 | 10/1980 | Schwetz et al. | 501/89 |
| 4,238,434 | 12/1980 | Enomoto et al. | 264/63 |
| 4,284,612 | 8/1981 | Horne, Jr. et al. | 423/345 |
| 4,292,276 | 9/1981 | Enomoto et al. | 422/199 |
| 4,314,852 | 2/1982 | Brennan et al. | 501/88 |
| 4,556,436 | 12/1985 | Addamiano | 437/100 |
| 4,710,480 | 12/1987 | Buschmann et al. | 501/95 |
| 4,756,895 | 7/1988 | Boecker et al. | 423/345 |
| 4,777,152 | 10/1988 | Tsukada | 501/80 |

FOREIGN PATENT DOCUMENTS

| | | |
|---|---|---|
| 0171819 | 2/1986 | European Pat. Off. . |
| 1104932 | 4/1961 | Fed. Rep. of Germany . |
| 1236482 | 3/1967 | Fed. Rep. of Germany . |
| 2158634 | 6/1973 | France .................... 423/345 |
| 58-49611 | 3/1983 | Japan . |
| 167836 | 6/1973 | U.S.S.R. .................. 423/345 |
| 2016524 | 9/1979 | United Kingdom . |

OTHER PUBLICATIONS

Journal of Crystal Growth, vol. 8, 1971 Phase Transformations, Habit Changes and Crystal Growth in SiC, pp. 341–353.

(List continued on next page.)

*Primary Examiner*—Robert L. Stoll
*Assistant Examiner*—Lori F. Cuomo

[57] ABSTRACT

Crystalline silicon carbide wherein at least 90 weight percent of the silicon carbide is formed from a plurality of hexagonal crystal lattices wherein at least 80 weight percent of the crystals formed from the lattices contain at least a portion of opposing parallel base faces separated by a distance of from 0.5 to 20 microns. The crystals may be in the form of separate particles, e.g. separate platelets, or may comprise an intergrown structure. The crystalline silicon carbide of the invention is produced by heating a porous alpha silicon carbide precursor composition comprising silicon and carbon in intimate contact to a temperature of from 2100° C. to 2500° C. in a non-reactive atmosphere. The materials are high performance materials finding use in reinforcing, high temperature thermal insulating, improvement of thermal shock resistance, and modification of electrical properties.

3 Claims, 4 Drawing Sheets

OTHER PUBLICATIONS

Hodgman et al, Handbook of Chemistry and Physics, 43rd edition, 1962, pp. 526–527.

"Phase Transformations and Grain Growth in Silicon Carbide Powders", Int. J. High Technology Ceramics 2 (1986), pp. 99–113—Published 8/14/86, Kistler et al.

Philips Research Reports, Growth Phenomena in Silicon Carbide, Knippenberg, Jun. 1963, vol. 18, No. 3, pp. 230, 231 and 271.

Journal of the Electrochemical Society, vol. 106, No. 6, Jun. 1959, pp. 526–527, Smith, Formation of Silicon Carbide Crystallites.

HEXAGONAL SILICON CARBIDE PLATELETS AND PREFORMS AND METHODS FOR MAKING AND USING SAME

This is a division of co-pending application Ser. No. 899,523, filed Aug. 22, 1986, now U.S. Pat. No. 4,756,895.

BACKGROUND OF THE INVENTION

1. Field of the Invention

This invention relates to silicon carbide used as a reinforcing material for other materials and more particularly relates to a previously unknown form of silicon carbide usable for this and other purposes, to a method for the manufacture of such novel silicon carbide, to a method for using same, and to the resulting novel reinforced products.

2. Background of the Invention

There is presently an ongoing worldwide research effort to utilize silicon carbide whiskers and fibers as reinforcing agents. Presently known whiskers, usually single crystals having a high aspect ratio, are based on beta phase or cubic structure silicon carbide and as a result are not well suited for fabrication of ceramic composites which require processing temperatures above 1800° C. due to the limited thermal stability of beta phase silicon carbide.

Nevertheless, attempts have been made to use such beta phase silicon carbide as reinforcing materials.

Examples of such prior art are discussed below.

U.S. Pat. No. 4,410,635, to Brennan et al., discloses discontinuous silicon carbide fiber reinforced ceramic composites which are formed by starting with the ceramic matrix material in a glassy state and converting it from a glassy state to a ceramic state after densification of the composite.

U.S. Pat. No. 4,399,231, to Prewo et al., discloses discontinuous silicon carbide fiber reinforced glass composites in which the silicon carbide fibers are laid up in substantially in-plane random direction orientation through utilization of a silicon carbide paper.

U.S. Pat. Nos. 4,387,080; 4,467,647; and 4,467,042, to Hatta et al., disclose the manufacture of flaky beta silicon carbide from an organic silicon polymer containing a metallic or non-metallic element such as Si, B, Ti, Fe, Al, Zr, Cr, and the like. The organic silicon polymer is molded into a thin sheet which is thereafter subjected to an anti-fusion treatment. This sheet is thereafter heated to a high temperature in an atmosphere of non-oxidative gas such as $N_2$, $H_2$, $NH_3$, Ar, and CO. The thermal treatment is carried on at a temperature not exceeding 1800° C. The resulting product is flaky beta silicon carbide. The infusible sheet of organic silicon polymer can be cut into small flaky pieces, each of which has a length and breadth 10-100 times greater than the thickness thereof, and these pieces may be converted to flakes of beta silicon carbide. Alternatively, flaking may be effected after heat treatment of a larger sheet. Also disclosed is the application of thin sheets or flaky materials for dispersion of thermal stress in composite materials such as rubber, plastics, metals, and concretes. Flaky beta silicon carbide having a width and length in the range of 10-100 times greater than the thickness thereof is taught as resisting breakage in an extrusion molding machine. Such beta silicon carbide does not, however, have high temperature resistance.

U.S. Pat. No. 3,661,662, to Allen, discloses a process for making sheets of material in which flakes of silicon carbide or boron carbide are floated on a pool of liquid metal which is inert to the flakes and bonding the concentrated flakes together on the surface of the pool to form a sheet thereof which is withdrawn from the surface of the pool. The bonding material is an organic resin.

Alpha silicon carbide including alpha silicon carbide of a hexagonal crystal structure is known. Such materials have not, however, been particularly suitable for use as reinforcing materials because in the prior art it was not possible to, or at least not practical to consistently make silicon carbide having a structure which was sufficiently pure and flawless to act as a good reinforcing material.

Individual large, typically between 0.1 and 3 cm, and usually intergrown hexagonal crystals sometimes spontaneously appear during synthesis of silicon carbide by Acheson electrofurnacing. Such crystals are, however, generally too large and too few relative to total silicon carbide prepared in the furnace, to be used as reinforcing materials. Even if such crystals were individually collected and crushed to smaller sized, the result would not be a good reinforcing material since such crushing operations result in a large number of flaws in the particles of the finished, crushed materials and also results in particles having an undesirable shape and size.

U.S. Pat. No. 3,962,406, to Knippenberg et al., discloses an inefficient method of manufacturing silicon carbide crystals in which a core of silicon dioxide is embedded in a mass of granular silicon carbide, or materials which form silicon carbide. Heating this mass to a temperature at which silicon dioxide volatilizes, i.e. above about 1500° C., results in formation of a cavity surrounded by silicon carbide. After formation of the cavity, heating is continued at a temperature above about 2500° C., at which silicon carbide crystals of plate shape are formed on the walls of the cavity.

Another patent disclosing the manufacture of hexagonal silicon carbide crystals is U.S. Pat. No. RE 26,941 to Lowe. This patent describes the preparation of large, ultrapure crystals by a slow and arduous vapor deposition process for electronic purposes for rectifiers and transistors. The crystals are up to 0.75 inches across with thicknesses of from 1 to 100 mils (25 to 2540 microns), see e.g. column 5, lines 59-61. Such materials are generally too large for most reinforcing applications.

American Matrix, Inc., formerly Phoenix International, of Knoxville, Tennessee, has recently announced the availability of particles of alpha silicon carbide for reinforcement of composite materials. The manner in which this material is made, however, has not been published. These particles under a microscope appear to be the result of crushing large particles. The product appears to be a mixture of various structures of various shapes, e.g. needles, powder, and fragments, including some hexagonal crystal material. The particles have a large number of faults and analysis indicates a low purity.

In summary, there are known to those skilled in the art many routes for the preparation of alpha or beta type silicon carbide from a variety of raw materials. However, there is no teaching or suggestion that thin single crystal, hexagonally shaped platelets of the more stable alpha type silicon carbide could intentionally be formed, nor is there any teaching as to how this may be accomplished on demand, nor that such platelets would have any unexpected utility.

Additionally, there is no teaching or suggestion of a porous silicon carbide matrix of small hexagonal crystal structure, i.e. where the base faces are separated by from 0.5 to 20 microns, nor any teaching or suggestion of a use for such a matrix.

BRIEF DESCRIPTION OF THE INVENTION

Figure 1:
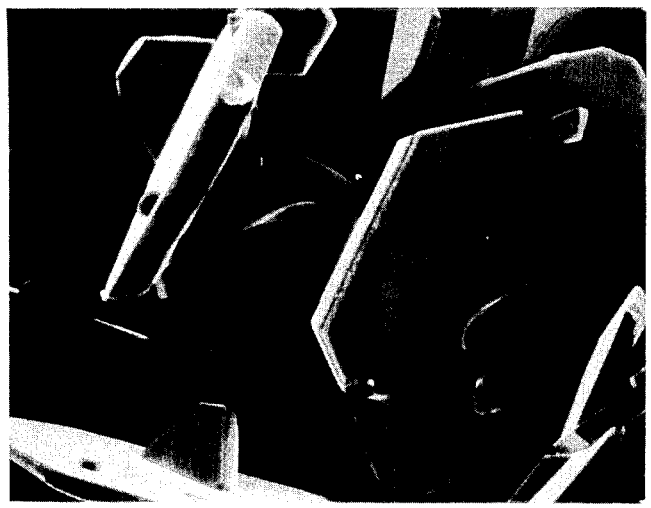
FIG. 1 is a photomicrograph of the product manufactured in accordance with Example 1.

In accordance with the present invention, there is provided crystalline silicon carbide wherein at least 90 weight percent of the silicon carbide is formed from a plurality of hexagonal crystal lattices wherein at least 80 weight percent of the crystals formed from the lattices contain at least a portion of opposing parallel base faces separated by a distance of from 0.5 to 20 microns.

The silicon carbide may be in the form of separate particles and at least 70 weight percent of particles may be composed of a single crystal lattice usually in the form of platelets.

Alternatively, the silicon carbide may be an integral porous structure comprising intergrown crystals. The porous structure may comprise either open or closed pore systems. The porous structure desirably has a porosity of between 5 and 80 volume percent and desirably has an average pore diameter of between 1 and 100 microns.

The invention also includes matrices which are reinforced by the particles of the present invention and articles formed by impregnating the porous structure. The matrix and impregnating materials may be glass including both amorphous glass and glass ceramics, ceramics, metals and polymers. After impregnation or initial formulation, certain amorphous glasses may be converted to microcrystalline ceramics. Examples of metals which may be used are various steels, aluminum, and metal alloys. The reinforced matrices and impregnated products of the invention are characterized by good strength fracture resistance and improved thermal conductivity. In addition when matrix material is a high temperature material such as sintered alpha silicon carbide, the product is characterized by exceptionally high temperature stability.

The silicon carbide of the present invention is produced by heating a porous silicon carbide precursor composition comprising silicon and carbon in intimate contact to a temperature of from 2100° C. to the decomposition temperature of silicon carbide, i.e. about 2500° C. in the presence of a hexagonal crystal growth control additive and in an inert atmosphere, e.g. a gas selected from nitrogen, inert (noble) gases, and mixtures thereof, for a time sufficient to cause formation of said crystals.

The growth control additive is usually a group III A metaal and is usually selected from boron, aluminum, and mixtures thereof. The boron and aluminum may be provided in the form of boron and aluminum compounds, e.g. $Al_4C_3$, AlN, $B_4C$, or BN; however, the control additive is not the compound but is the aluminum or boron in the compound.

The growth control additive is usually present in an amount of from 0.3 to 5 percent by weight of silicon in the precursor composition.

The most usual precursor compositions are selected from beta silicon carbide powder and a mixture of particulate silica and carbon or particulate silicon and carbon in stoichiometric amounts to form SiC. The average particle size of the precursor materials is usually between about 0.005 and 5 microns: however, when a precursor material such as silica forms gaseous products prior to reaction, a much larger particle size, e.g. 100 microns, can be used.

When separate particles are desired, a loose powder precursor is used; and when an intergrown porous structure is desired, an agglomerated precursor is used.

The novel products of the invention have utility in improving the strengths of materials including stiffening in metals and toughening of ceramics. In addition the materials find utility in modifying heat transfer properties in materials, can provide improved thermal shock resistance in ceramics, can act as insulators and can improve erosion resistance in most materials. Additionally the products of the invention have good oxidation and chemical resistance.

DETAILED DESCRIPTION OF THE INVENTION

The silicon carbide which is the subject of this invention is alpha silicon carbide as opposed to the beta form of silicon carbide. Alpha silicon carbide is preferred in accordance with the present invention because of its higher temperature resistance and better structural integrity.

In particular the invention comprises that form of silicon carbide formed from the "hexagonal crystal lattice," i.e. the crystal lattice which will form a hexagonally shaped silicon carbid crystal if allowed to grow freely. While there are several such crystal lattices including mixtures of lattice types (polytypes), which are acceptable in accordance with the present invention, the most common are the 6H and 4H crystal forms. These hexagonal silicon carbide crystals defined by the hexagonal crystal lattice, when freely and completely grown, are characterized by two parallel hexagonally shaped "base faces" connected at their edges by "lateral faces."

The silicon carbide crystals formed from the hexagonal crystal lattices are not always complete, i.e. the base faces are not always perfect hexagons but the crystals are usually characterized by containing at least a portion of opposing parallel base faces which base faces are separated by a distance of from 0.5 to 20 microns. In this disclosure such incomplete crystals are nevertheless of a "hexagonal crystal structure" and the crystals are called "hexagonal crystals". The silicon carbIde product of the invention always contains a plurality of such crystals, e.g. always over 1,000 and usually over 10,000.

The silicon carbide of the invention may either comprise separate hexagonal crystal particles or may be an intergrown structure comprising intergrown hexagonal crystals.

When the silicon carbide comprises separate particles, at least 70 weight percent of the particles are in the form of platelets. These platelets are single crystal particles having parallel base faces wherein the longest distance across each of the base faces on the average is at least six and usually at least eight times the distance between the base faces. In a platelet the ratio of the maximum to minimum dimension of the base face is usually between 1 and 3. Each of the base faces of these platelets desirably contain at least two adjacent 120° corners, which corners are characteristic of the hexagonal crystal structure. Such corners are usually separated by a distance of from 2.5 to 150 microns.

The particulate crystalline silicon carbide of the invention is further characterized by a low flaw, i.e. fracture, rate. When viewed at a magnification of 200 power by an optical microscope, fewer than 10, and usually fewer than 2, cracks or fractures are seen per 100 bases observed. Morphology which results from incomplete crystal growth is not considered a flaw, crack, or fracture.

When the silicon carbide is an integral porous structure, it comprises a plurality of intergrown crystals formed from hexagonal crystal lattices. For purposes of this invention, intergrown crystals are considered as being different crystals. The observable non-intercepting crystal portions continue to be characterized by having at least a portion of opposing parallel base faces separated by a distance of from 5 to 20 microns. The integral porous structure usually has a porosity of between 5 and 80 and preferably between 35 and 65 volume percent and an average pore diameter of between 1 and 100 microns. The pore structure may either be of the open or closed type, depending upon the desired application.

The silicon carbide of the present invention is characterized by high purity, i.e. over 95% pure and often over 99% pure. Characteristic weight percent impurities are iron lens than 0.5%, combined boron and aluminum between 0.03 and 3%, free silicon less than 0.5%, free carbon less than 0.5% and all other impurities less than 0.5% total. Most of the boron and aluminum impurities result from the addition of these elements as growth control additives. Much of the residual boron and aluminum is surface contamination with internal boron and aluminum impurities being less than their solid solution limits in silicon carbide, e.g. less than about 3,000 parts per million for boron and less than about 4,000 parts per million for aluminum.

The silicon carbide products of the present invention have utility in various reinforced structures. The products can add strength, fracture toughness and shock resistance, while improving or maintaining thermal stability. The free platelets can be incorporated into various matrices as reinforcing aids. Such matrices include glasses including amorphous glasses and glass ceramics, crystalline ceramics, metals, and polymers. Examples of amorphous glasses include silicate glasses and glasses which may subsequently be converted to glass ceramics. Examples of ceramics which may be reinforced include silicon carbide, alumina and zirconia. Essentially all metals may be reinforced especially alloys of Iron (steel) and aluminum and other metal alloys. Such alloys may be high temperature alloys, i.e. super alloys. Polymers which can be reinforced by the platelets include both thermoplastic and thermoset resins, e.g. polyolefins, vinyl resins, nylons, polycarborates, and epoxys. When such platelets are used for reinforcement, they are usually present in an amount of about 10 to about 70 volume percent.

The intergrown porous structure may be impregnated with a material to form strong and shock resistant articles. Examples of materials with which the porous structure may be impregnated include amorphous glasses including those which may be subsequently converted to glass ceramics and polymers and metals as previously described. Ceramics may be incorporated into the matrix by vapor impregnation.

The method for producing the silicon carbide of the present invention comprises heating a porous silicon carbide precursor composition comprising silicon and carbon in intimate contact to a temperature of from 2100° C. to 2500° C. in the presence of a hexagonal crystal growth control additive and in a non-reactive atmosphere. A "non-reactive atmosphere" is any atmosphere comprising a vacuum or gases which, exclusive of gaseous reaction products, will not significantly adversely affect $\alpha$ silicon carbide hexagonal crystal growth. Gases which are suitable include nitrogen and the noble gases. Oxidizing atmospheres are generally undesirable. The reaction is carried out for a time sufficient to cause formation of the silicon carbide crystals.

The precursor composition may be a chemical combination of silica and carbon such as silicon carbide or polycarbosilanes in particulate or liquid form. Silicon carbide is always in particulate form including crystalline, whiskers, needles, or powders and is usually, but not always, beta silicon carbide. The precursor may also be an intimate blend of reaction components to form silicon carbide including blends of silicon with carbon or silica with carbon in proper stoichiometry to yield alpha silicon carbide comprising a plurality of hexagonal crystal lattices wherein at least 80 weight percent of the crystals formed from the lattices contain at least a portion of opposing parallel base faces separated by a distance of from 0.5 to 20 microns. The silica, where used, may be particulate or may be used in the form of a sol. While not wanting to be bound by any particular theory, it is believed that when silica, silicon, or carbon are used, the silicon carbide passes through the beta form before forming the alpha hexagonal crystal structure.

The precursor materials provide a mixture of reactants within 10 mole percent of stoichiometry according to the equations.

$$\text{beta SiC} \rightarrow \alpha\text{SIC} \tag{1}$$

$$\text{Si} + \text{C} \rightarrow \text{beta SiC} \rightarrow \alpha\text{SiC} \tag{2}$$

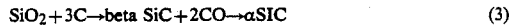

$$\text{SiO}_2 + 3\text{C} \rightarrow \text{beta SiC} + 2\text{CO} \rightarrow \alpha\text{SIC} \tag{3}$$

To meet such stoichiometry for equation 3, the precursor material may contain from about 58 to about 66 weight percent silicon and 34 to 42 weight percent carbon and preferably from about 60 to about 65 weight percent silica and from about 35 to about 40 weight percent carbon.

The precursor materials must be very fine and intimately blended. The average particle size of the precursor materials is usually between 0.005 and 2 microns. When the precursor material is silica, much larger particles may be used, e.g. 100 microns or higher. The reasons for this are not completely understood, but may relate to the formation of gaseous products containing silicon at reaction temperatures.

The precursor materials are desirably of high purity and may be obtained from any suitable source.

The most common carbon source is colloidal size carbon (carbon black or lamp black). The usual particle size for carbon black is between about 0.01 and 1 micron.

The silica used may be fumed silica or obtained by ashing seed hulls, especially rice hulls in air. Other seed hulls such as babassu nut shells may also be used. Silica may have a particle size as small as 0.005 microns. The particle size for silica may therefore range widely, e.g. 0.005 to 100 microns or more.

A mixture of silica and carbon in about a 1:1 weight ratio may be obtained by pyrolyzing seed hulls in an inert atmosphere, e.g. rice hulls, at 800° C. Various other silica-carbon ratios can be obtained by varying the pyrolyzing temperature between 400 and 1000° C.

In the method, the silicon and carbon in the precursor must be in intimate contact. When beta silicon carbide is used as the precursor, this contact is on the molecular level. When carbon is used as part of the precursor, it must be of very small particle size, e.g. a micron or smaller and must be well mixed with the silicon source material. The silicon source material can usually be of a larger particle size since it is believed to at least partially vaporize at reaction temperature to cause contact at the molecular level.

The reaction must take place in a nonreactive atmosphere, e.g. in nitrogen or in an inert gas such as argon. It is to be understood that the reaction may take place at subatmospheric or superatmospheric pressure. When beta silicon carbide is used as the precursor, a high vacuum may be used, eliminating the need for a gas.

Beta silicon carbide powders and whiskers may be obtained by methods known to those skilled in the art as for example taught in U.S. Pat. Nos. 3,340,020; 3,368,871, and 4,013,503. Desirable beta silicon carbide precursors have average particle sizes between 0.1 and 2 microns.

The precursor must be porous, i.e. loosely packed, and where individual crystal particles, e.g. platelets, are desired, must also be individual particles. When an intergrown structure is desired, the precursor material should be agglomerated, e.g. by mixing the material in a liquid followed by removing the liquid and drying the product. If desired, to increase agglomeration, a small percentage of temporary binder such as a resin may be included in the liquid. The porosity of the starting material should be between 20 and 70 volume percent and the average pore diameter is usually between 1 and 100 microns.

The hexagonal growth control additive is any additive which will promote the growth of alpha silicon carbide hexagonal crystal platelets. Such additives are usually metals selected from group IIIA of the periodic table, especially boron, aluminum, and mixtures thereof. The growth control additive when percent in the precursor is in an amount of from 0.3 to 5 percent and preferably 1 to 3.5 percent by weight of silicon in the precursor composition. The growth control additive may be a fine, e.g. 0.4 to 5 micron, powder blended into the precursor material, or may be provided in the vapor phase during heating, e.g. by vaporization from an impregnated crucible or by vaporization from a quantity of the growth control additive which is not blended with the precursor material. When a vapor is used, the aluminum or boron is at a vapor pressure sufficient to generate material transfer from the atmosphere to the resulting silicon carbide to form a solid solution of at least 300 parts per million. The growth control additive may for example be placed in the bottom of a crucible and vaporized through precursor material in the top of the crucible during heating. The growth control additive may be initially provided as a compound of boron or aluminum, e.g. $Al_4C_3$, AlN, $B_4C$, BN, or may be provided as metallic boron or aluminum. Regardless of how the additive is included, it is to be understood that the growth control additive is the boron or aluminum and not the compound. Unless otherwise indicated, calculations herein are therefore based upon weight of boron or aluminum.

Any suitable non-contaminating, temperature resistant crucible may be used, e.g. crucibles made from graphite, SiC, $B_4C$, or BN.

The heating temperature is between 2100° to 2500° C. A preferred range is between 2150° and 2400° C. The higher temperatures, e.g. above 2250° C. are usually required when nitrogen gas is used and the lower temperatures may be used with an inert gas.

The heating time required to form the desired crystal structure, according to the methods of the invention, is usually between 3 minutes and 24 hours and is most often is at least 15 minutes. The most common heating times are between 10 minutes and one hour.

A specific method for the preparation of the silicon carbide of the invention is:

A. Mixing together finely divided silica, finely divided carbon, and finely divided boron or a boron-containing compound, the amount of $SiO_2$ to C being from about 90 to 110 percent of stoichiometric as per the reaction $SiO_2 + 3C = SiC + 2CO$, the amount of elemental boron being from 0.35 to 3.5 percent based upon silicon; and B. Heating the mixture in argon to a temperature of between 2100° and 2500° C. for a time sufficient to convert the mixture into hexagonal crystal lattice alpha silicon carbide crystals which may or may not be intergrown depending upon whether or not the initial starting material comprised discrete particles or was agglomerated.

The mixture is most commonly heated in a high temperature crucible, e.g. made of graphite.

A specific example for producing a rigid, porous SiC article comprises combining 100 parts by weight of finely divided beta silicon carbide powder, sufficient hexagonal crystal growth control additive selected from elemental boron, elemental aluminum, a compound containing boron, a compound containing aluminum or mixtures thereof, to yield from 0.25 to 2.5 parts by weight of elemental boron or aluminum and combining the dry resulting mix with a blend of 30 to 50 parts by weight of denatured ethanol, 5 to 8 parts by weight of polyvinyl alcohol, 1 to 2 parts by weight of oleic acid and 100 to 200 parts by weight of deionized water. The entire mix is blended in a high shear mixer and the resulting homogenous composition is then spray dried. The dried mix is then compacted to between 30 and 50 percent of the theoretical density of silicon carbide and is fired in argon at a temperature of between 2150° and 2400° C. for from 10 minutes to 1 hour. The resulting product will be an open-pore ceramic article comprised of intergrown crystals of hexagonal crystal lattice alpha silicon carbide crystals. The bulk density will be between 30 and 70 percent of the theoretical density. When this procedure is followed in the absence of the polyvinyl alcohol and oleic acid and the premix is dispersed to a low bulk density before firing, the result will be individual hexagonal type crystals.

Seed hulls, e.g. rice hulls or babassu nut shells, may be used for producing single crystal platelets of hexagonal crystal lattice alpha silicon carbide. For example, specifically, rice hulls may be ashed in air at 800° C. to obtain amorphous SiO₂, and rice hulls may be pyrolyzed in an oxygen deficient atmosphere which at about 800° C. produces a residue containing C and SiO₂ in about a 1:1 weight ratio.

The rice hulls may therefore be used as a source of silica and also of carbon. When a 1:1 weight ratio of silica to carbon is used, additional silica is required for stoichiometry. The additional silica may be provided by any suitable source including ashed rice hulls as previously described. In such a case from about 30 to 36 parts by weight of ashed rice hulls could be comminuted with 100 parts by weight of pyrolyzed rice hulls.

The mixture would then be heated in an inert gas or nitrogen containing boron or aluminum vapor to a temperature of from about 2150° C. to about 2500° C. for a time sufficient to form discrete platelet crystals of alpha silicon carbide.

EXAMPLE 1

120 grams of beta silicon carbide powder having an average particle size of 0.3 microns was charged into a 2¼ inch wide by 9½ inch long by 1 inch deep graphite crucible. The powder contains less than 0.06% total iron, less than 0.28% free silica and less-than 0.44% free carbon. Prior to charging the powders were screened through a 60 mesh cloth. The loose powder was charged to about one inch deep. A crystal growth control additive comprising 0.5%, based upon the weight of beta SiC charge, was added into the bottom of the crucible prior to addition of the silicon carbide powder. The crystal growth control additive comprised a mixture of 0.61g of −325 mesh metallic boron and 0.81g of −100 mesh Al₄C₃ powder.

The covered container plus charge was passed through a 6' ID graphite tube furnace in a nitrogen atmosphere with the center of the hot zone being 2300° C. The residence time in the hot zone was about one hour.

The resulting product was in the form of a loose powder which under an optical microscope appears as hexagonal silicon carbide platelets having an average maximum dimension of about 130 microns with an average aspect ratio (maximum dimension divided by thickness) of about 12. The yield of hexagonal crystals is over 95 weight percent.

FIG. 1 shows an SEM 400 power photomicrograph of typical platelets made in accordance with this example. The platelets are characterized by a very low fracture rate and high purity.

EXAMPLE 2

About 77 grams of −325 mesh aluminum oxide powder was placed in a 16 ounce plastic container along with 50 aluminum oxide 0.5 inch diameter cylindrical grinding media and 0.39 grams of submicron magnesium oxide. Distilled water was added to make the container three-fourths full and the mixture was milled overnight on a roller mill.

The mixture was removed from the mill and poured into a glass dish which was then placed on a hot plate on low heat while stirring to prevent the aluminum oxide from getting. 20 weight percent platelets prepared as in Example 1 were gradually added as the slurry thickened. When the slurry became too thick to stir, the dish was removed from the hot plate and placed in an oven at about 70° C. overnight for final drying. The product was then cooled and screened through a 40 mesh screen.

The product was then hot pressed in a two and one-half inch graphite mold at 1550° C. and 2000 psig. The product was easily released from the mold and appeared very uniform and dense. The final product sample was 0.311 inch thick by 2.49 inches in diameter. The density was about 98% of theoretical.

EXAMPLE 3

Silicon carbide platelets prepared as in Example 1 were placed in a mold. The platelets were in loose form and had a porosity of about 57 volume percent. Molten aluminum alloy (89% Al, 9% Si and 2% Mg) at a temperature of about 765° C. was applied at a pressure of up to about 17,500 psi during impregnation of the platelets. The resulting product was characterized by having essentially no porosity, i.e. about 0.5% and about 31 volume percent silicon carbide. The Youngs modulus of the composite material was about 20,000,000 psi as compared with the unreinforced metal at about 10,000,000 psi.

EXAMPLE 4

150 grams of beta silicon carbide powder having an average particle size of about 0.3 microns was mixed in a beaker with 1.5 grams of submicron boron powder.

9.5 grams of 25% polyvinyl alcohol in water, 1.5 grams of oleic acid, 50cc of denatured ethanol, and 200cc water were hand stirred. Mixed solids were then added to the mixed liquids in a blender and mixed for three minutes.

Figure 2:
FIG. 2 is a photomicrograph of the product manufactured in accordance with Example 4.

The blended-slurry was then spray dried. 75 grams of the spray dried powder was compacted to a volume of 63.5cc. The approximate green density was about 37% of theoretical. The compact was fired in argon at 2150° C. for about one hour. The fired density of the resulting perform was about 45% of the theoretical density SiC with much in the hexagonal crystalline form and with about 55% porosity. An SEM 260 power photomicrograph of a typical preform made substantially in accordance with this example is shown in FIG. 2.

EXAMPLE 5

A preform prepared substantially in accordance :with Example 4 was impregnated with an aluminum alloy comprising 89 wt % Al, 9% Si, and 2% Mg at a temperature of about 765° C. at a pressure of up to about 17,500 psi.

The resulting product was characterized by having almost no porosity and comprised about 51 weight percent alloy and about 49 weight percent silicon carbide.

EXAMPLE 6

About 60 grams of about 240 mesh silica, 36 grams of carbon black, and 0.96 grams of submicron boron powder were stirred for 20 minutes in 200cc of acetone. The mixture was dried overnight in air. The dried mix was hand stirred and screened through a 100mesh stainless steel screen. The screened powder was then placed in a graphite crucible, covered, and fired at 2150° C. in argon.

The conversion of raw materials to SiC platelets is close to 100% of theoretical. The average aspect ratio is between 10 and 15.

Figure 3:
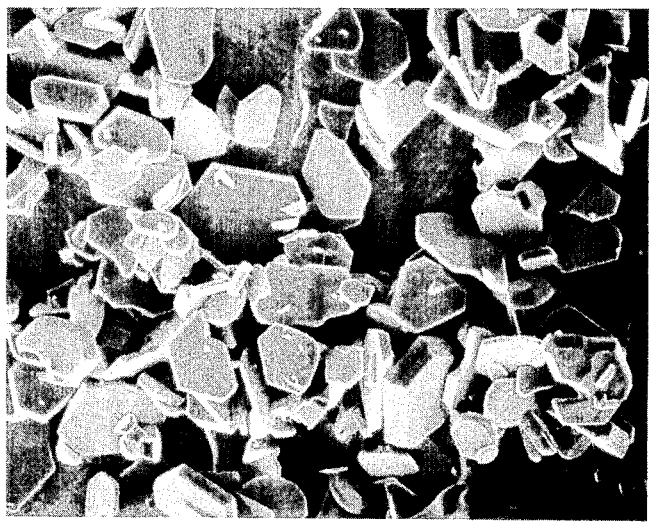
FIG. 3 is a photomicrograph of the product manufactured in accordance with Example 6.

FIG. 3 shows an SEM 500 power photomicrograph on −400 mesh fraction of platelets made substantially in accordance with this example. The other fractions show similar morphology and distribution.

EXAMPLE 7

125 grams of −325 mesh silicon powder was ground in a vibrational mill for 24 hours using 2200g of cylindrical 0.5 inch diameter by 0.5 high silicon carbide media in 200cc of heptane and 8cc denatured ethanol.

The ground slurry was dried overnight. Media loss was 3.02g. Average particle size after grinding was 0.75 micron.

Three batches using the above ground material were made using different growth control additives as set forth in Table 1.

TABLE 1

| Si metal | Carbon black | Acetone | Growth Control Additive |
|---|---|---|---|
| 1. 35 g + 1 g media wear | 15 g | 150 cc | 1.02 g submicron boron powder |
| 2. 35 g + 1 g media wear | 15 g | 150 cc | 1.02 g aluminum powder −400 mesh |
| 3. 35 g + 1 g media wear | 15 g | 150 cc | 0.51 g boron powder plus 0.51 g aluminum powder |

Each of the foregoing batches were mixed for 20 minutes using a magnetic stirrer and dried overnight.

The samples were fired in a graphite tube furnace at from 2100° to 2150° C. for about one hour in argon.

Figure 4:
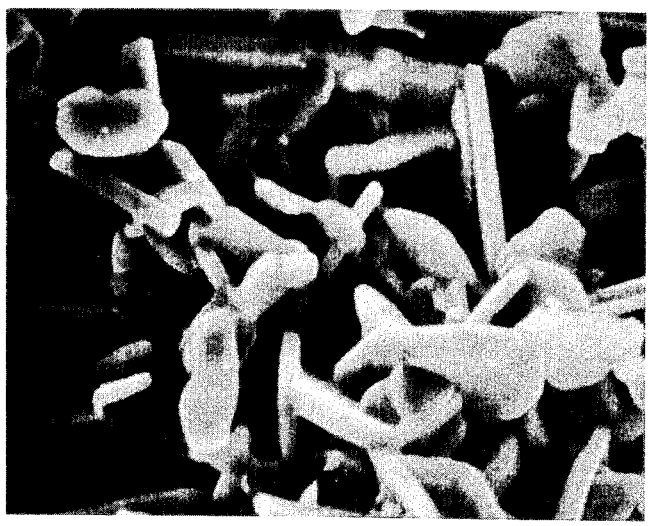
FIG. 4, 5 and 6 are photomicrographs of the product manufactured in accordance with Example 7.
Figure 5:
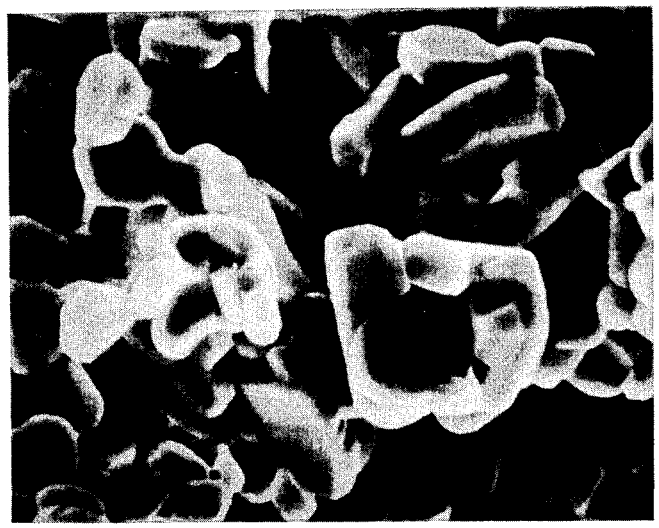
Figure 6:

The yield is over 90% free and intergrown hexagonal crystals. SEM 1750 power photomicrographs of 1, 2, and 3 are shown in FIGS. 4, 5, and 6 respectively.

These samples were analyzed by x-ray diffraction to determine crystal type. These are shown in Table 2 to be almost entirely 4H and 6H hexagonal type crystals.

TABLE 2

| Sample No. | 1 | 2 | 3 |
|---|---|---|---|
| Crystal Type | | | |
| Alpha SiC 6H | Major | Major | Major |
| Alpha SiC 4H | Low | Major | Minor |
| Alpha SiC 15R | Low | Low | Low |

EXAMPLE 8

Rice hulls were mixed in a blender and passed through a 20 mesh screen.

50 grams of the hulls were placed in a crucible and heated to 800° C. in flowing nitrogen to obtain amorphous $SiO_2$ and carbon in a ratio of about 1:1.

The pyrolyzed rice hulls were ground in a vibratory mill to about −200mesh.

36 grams of the ground pyrolyzed rice hulls with 12 grams of fumed silica were mixed for one minute in a blender.

Into a cylindrical graphite container 3 inches inside diameter by 2.5 inches deep was placed 50cc a growth control additive coating suspension comprising 0.4 grams of submicron boron poWder and 0.55 grams −100 mesh aluminum carbide powder, 0.02 grams polyvinyl acetate and 50cc of ethanol. The suspension was dried to form a film on the bottom of the crucible.

14.5 grams of the pyrolyzed rice hull-fumed silica mix were then placed in the crucible.

The crucible was covered and heated in nitrogen in a tube furnace at a major heat zone of 2250° to 2300° C. for about one hour.

Figure 7:
FIG. 7 is a photomicrograph of the product manufactured in Example 8.

The yield of silicon carbide platelets was about 75 percent of theoretical. Platelets prepared substantially in accordance with this example are shown in the 400X optical photomicrograph of FIG. 7.

The average size of the platelets is less than 150 microns and the aspect ratio (maximum dimension/thickness) is between about 15 and 20.

EXAMPLE 9

3.55 grams of silicon carbide platelets having a size fraction of −60/+200 mesh were wet mixed with 20 g of submicron alpha SiC powder, 0.13 g of $B_4C$ and 1% phenolic resin as a carbon source and subsequently dried.

A 1-inch diameter disc was prepared by compacting 10 g of the mixture at 20,000 psi to a green density of 55% of theoretical. Pressureless sintering was conducted at 2150° C. in an argon atmosphere with a 2½ hour hold at temperature. The resulting sintered density was 82.7% of theoretical. The fracture surface of this sample was studied by SEM showing that the platelets fully survived in the matrix.

What is claimed is:

1. A method of producing hexagonally shaped platelets of alpha silicon carbide comprising:
  A. Mixing together powdered silica, finely divided carbon of from 0.005 and 2 microns average particle size and finely divided boron or a boron-containing compound of from 0.4 to 5 microns average particle size, the amount of $SIO_2$ to C being from about 90 to 110 percent of stoichiometric as per reaction $SIO_2+3C=SiC+2CO$, the amount of elemental boron being from 0.35 to 3.5 percent based upon silicon; and
  B. heating the mixture in argon to a temperature of between 2100° and 2500° C. for a time sufficient to convert the mixture into hexagonally shaped platelets of silicon carbide.

2. The method of producing a crystalline silicon carbide product wherein at least 90 weight percent of the product is in the form of a plurality of hexagonal crystal lattices and wherein at least 80 weight percent of the crystals formed from the lattices contain at least a portion of opposing parallel base faces separated by a distance of from 0.5 to 20 microns, said method comprising heating a porous silicon carbide precursor composition comprising silicon and carbon in intimate contact to a temperature of from 2100° C. to 2500° C. in the presence of a hexagonal crystal growth control additive and in a non-reactive atmosphere, for a time sufficient to cause formation of said crystals, wherein the growth control additive is selected from boron, aluminum and mixtures thereof and wherein the growth control additive is present in an amount of from about 0.3 to about 5 percent by weight of silicon in the precursor composition and wherein the precursor composition is an intimate mixture of from about 58 to about 66 weight percent silica with from about 34 to 42 weight percent carbon and wherein the silica is obtained by ashing seed hulls in air.

3. The method of claim 2 wherein the seed hulls are rice hulls.

* * * * *